United States Patent [19]

Smith

[11] Patent Number: 5,690,467
[45] Date of Patent: Nov. 25, 1997

[54] IC TRAY HANDLING APPARATUS

[75] Inventor: Nathan R. Smith, Stillwater, Minn.

[73] Assignee: Advantek, Inc., Minnetonka, Minn.

[21] Appl. No.: 723,983

[22] Filed: Sep. 30, 1996

Related U.S. Application Data

[62] Division of Ser. No. 276,336, Jul. 18, 1994, Pat. No. 5,588,797.
[51] Int. Cl.⁶ .................................................. B65G 57/30
[52] U.S. Cl. ............................................................ 414/795.2
[58] Field of Search ............................ 414/416, 788.7, 414/795.2, 797.5; 53/249

[56] References Cited

U.S. PATENT DOCUMENTS 3,363,781  1/1968  Magnetti ........................ 414/797.5 X
5,201,875  4/1993  Tessier et al. ........................ 294/64.1
5,397,213  3/1995  Ushiki ............................ 414/788.7 X

FOREIGN PATENT DOCUMENTS 60-209436  10/1985  Japan ............................ 414/797.5
5-728A    1/1993  Japan ............................ 414/797.5

*Primary Examiner*—Janice L. Krizek
*Attorney, Agent, or Firm*—Burd, Bartz & Gutenkauf

[57] ABSTRACT

A microchip tray handling apparatus has microchip loading and receiving units for supplying microchips to a microchip tester and receiving tested microchips. The units have tables to support stacks of trays containing microchips. Each unit has a tray holding assembly for raising a stack of trays to allow a bottom tray to allow a bottom tray to be moved along the table. Pick, invert and place probes remove microchips from the trays and place tested microchips back into the trays.

8 Claims, 5 Drawing Sheets

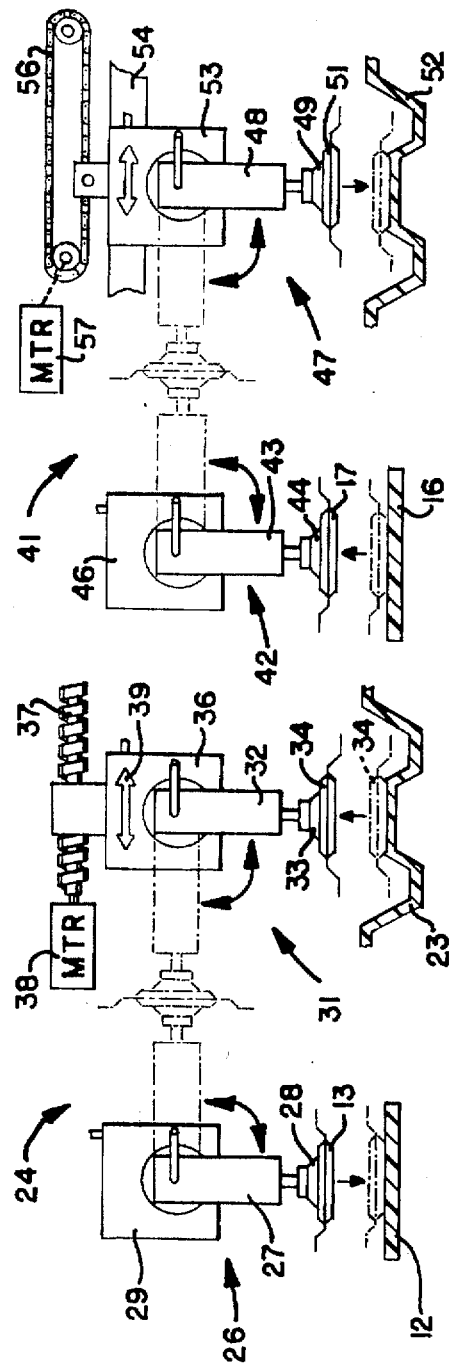
FIG. 2
FIG. 3
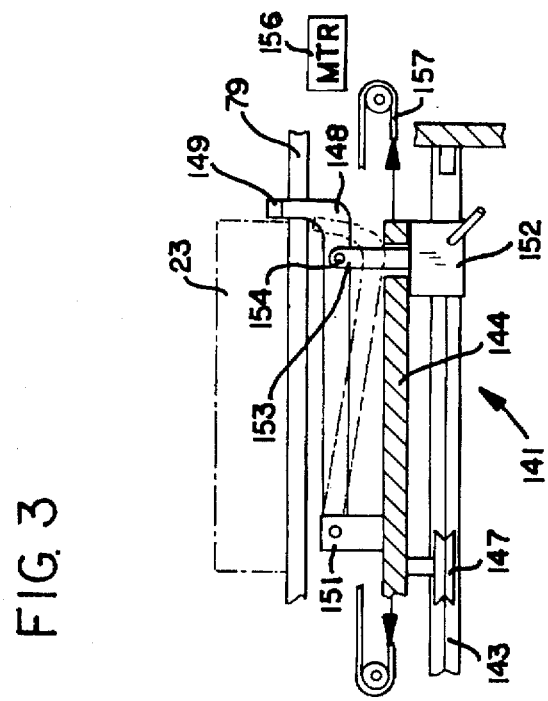
FIG. 6
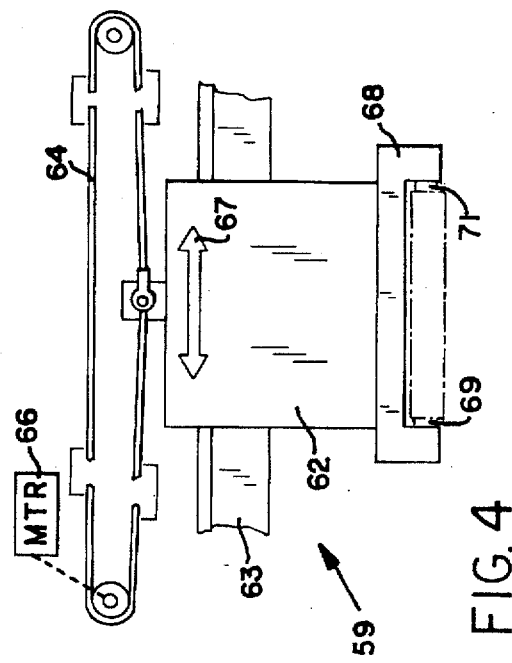
FIG. 4

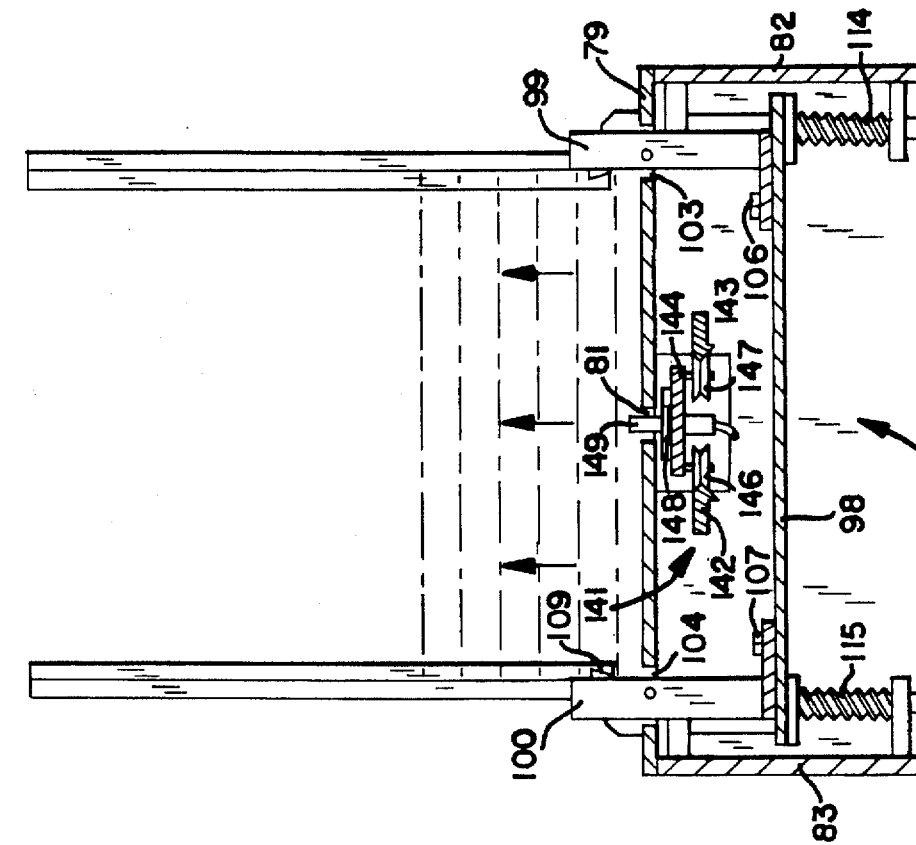
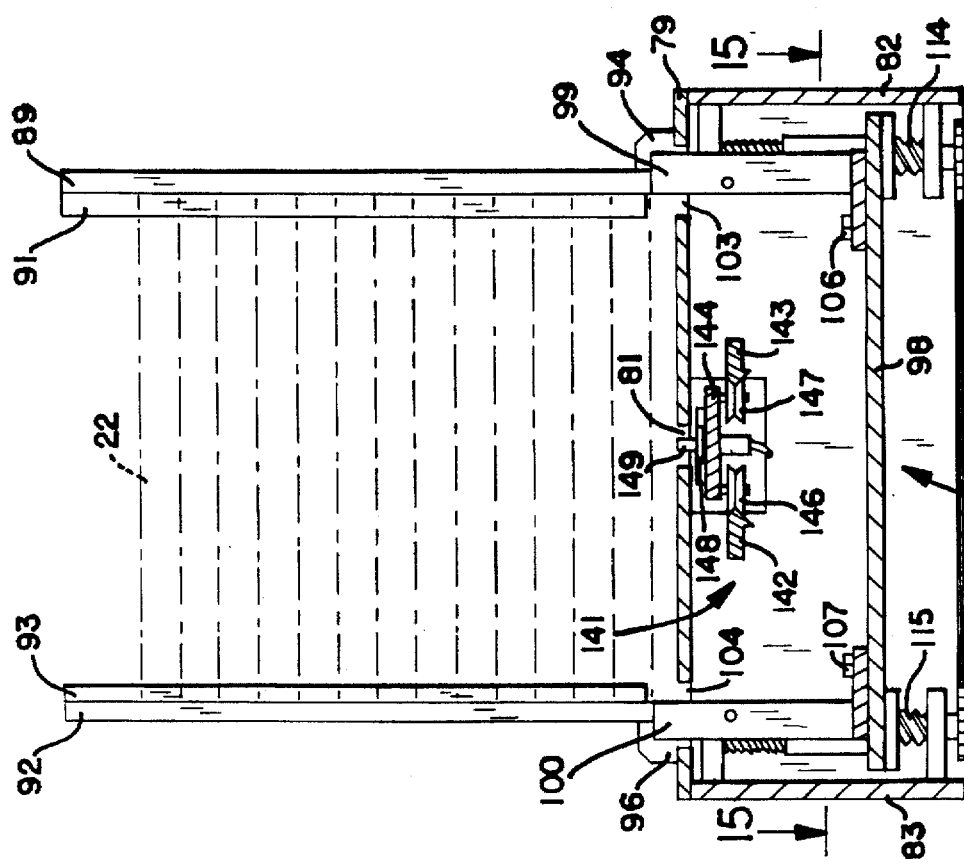

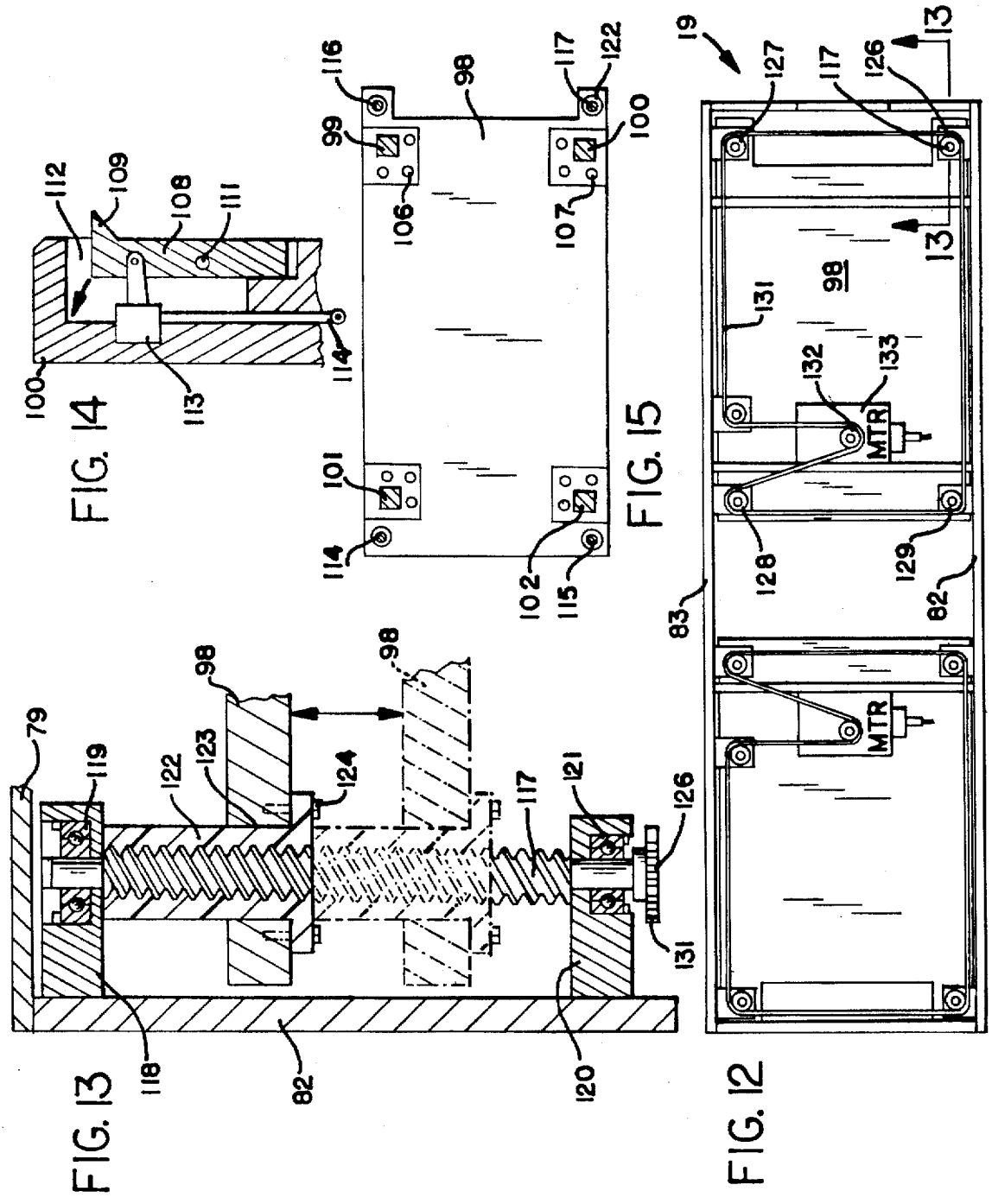

IC TRAY HANDLING APPARATUS

This application is a divisional of application Ser. No. 08/276,336, filed Jul. 18, 1994, now U.S. Pat. No. 5,588,797.

FIELD OF THE INVENTION

The invention relates to article handling apparatus operable to dispense and receive articles normally stored in packaging structures. The article handling apparatus handles trays storing microchips which are removed from the trays for testing and returned to the trays after the testing is completed.

BACKGROUND OF THE INVENTION

Computer IC chips called microchips must be tested for operability, efficiency and environmental compatibility after they are manufactured. Machines that automate such testing have been developed to reduce the amount of labor required to perform tests on relatively small microchips. Microchips are stored in generally rectangular trays which protect the microchips during transport from the manufacturer to the testing location and to the final assembly place. The microchips are individually tested apart from their storage trays. The trays are manually placed in tray handling devices having automated structures that remove each microchip from the tray and place the microchip on a belt which delivers the microchips to a testing machine. Probes and inverting devices have been developed to pick up microchips from the trays and place them in a desired location, such as a belt which move the microchips to a testing machine. An example of a probe and inverting device is shown in U.S. Pat. No. 5,201,875. The loading and unloading of the trays into and from the tray handling devices is a tediously repetitive manual operation which subjects the hand, wrists and arms of personnel to stresses and strains.

SUMMARY OF THE INVENTION

The invention is directed to an integrated circuit, IC, tray handling apparatus and method that accommodates a stack of trays holding microchips and functions to separately remove microchips from a tray onto a moving belt for delivery to a microchip tester. The entire stack of trays is quickly and easily loaded from the end of the tray handling mechanism of the apparatus. The efficient handling of the stack of trays also reduces strains and stresses on the hands, wrists and arms of personnel handling the stack of trays.

The apparatus has a loading tray unit and receiving tray units. The loading unit accommodates a stack of trays having microchips. The bottom tray is moved from a first position to a second position on a table where the microchips are picked up and transferred onto a belt that delivers the microchips in sequence to an IC tester. A second belt moves the tested microchips from the IC tester. A second microchip pick up and transfer mechanism individually picks up the microchips and places them in empty trays. Rejected microchips are placed in a tray separate from the acceptable microchips. The microchip loading and receiving units have tray holders connected to lift structures that selectively move the holders in an upward direction so as to raise the stack of trays above the bottom tray so that the bottom tray can be moved in a forward direction allowing the microchips in the bottom tray to be picked up, inverted and transferred to the belt that delivers the microchips to the IC tester or pick up microchips from the belt that dispenses microchips from the IC tester depositing the microchips back into a tray.

The preferred embodiment of the apparatus for handling and stacking trays holding microchips has a generally horizontal table for supporting trays. Ribs secured to the table provide guides for the trays as they move along the table. Upright posts mounted on the table adjacent the ribs have inwardly directed lips providing stops for the stack of trays and locate the trays in a first position on the table. The ribs and posts do not interfere with the horizontal loading of the stack of trays on the table. A tray handling assembly operates to lift the stack of trays except the bottom tray so that the bottom tray can be moved to a second position where the microchips are picked up from the tray, inverted and deposited onto a belt for delivery to a microchip tester. The tray holding assembly has upright holders or members having movable pawls that engage opposite sides of a tray so as to lift the stack of trays and subsequently lower the trays back on the table. The holders extend through holes in the table and are mounted on a plate located below the table. The plate is selectively moved up and down with lead screws driven by an electric motor. The screws are threaded through sleeves mounted on the plate so that rotation of the screws moves the plate and holders mounted thereon. A tray moving device having a carriage movably mounted on rails below the table and a finger adapted to engage the bottom tray operates to move the bottom tray from the first position to a second position.

A microchip pick up, transfer and place mechanism has vacuum suction cups connected to air cylinders operable to pick up a microchip from the tray, invert the microchip and place the microchip on a belt for delivery to a microchip tester. This procedure is continued until all of the microchips are removed from the tray. The tray moving device then moves the empty tray to a third position into engagement with end stops on the table. The empty tray is elevated with a second tray holding assembly having holders that engage opposite sides of the tray.

A tray transfer mechanism picks up the empty tray and moves it to a microchip receiving unit. A second microchip pick up, transfer and place mechanism picks up microchips from a belt carrying tested microchips from the tester, inverts the microchips and places the microchips in a tray located on a table of the receiving unit. Rejected microchips are deposited in separate trays located on a second receiving unit. The receiving units have tray moving devices that move the trays from the microchip loading position to a stacking position on the table. A tray holding assembly elevates the stack of trays so that a new tray can be placed under the stack of trays. The tray holding assembly operates in the same manner as the tray holding assembly in the loading unit. The entire stack of trays on the receiving unit is manually removed from the unit after a selected member of trays accommodating tested microchips have been stacked on the receiving unit. The stack of trays are moved horizontally from the table in an efficient manner that minimizes stresses and strains on the hands, wrists and arms of persons handling the trays.

A method of handling trays is included in the invention. A stack of trays holding microchips is loaded on a table in a first position. The stack of trays is moved in a general longitudinal and horizontal direction to reduce stresses and strains on the hands, wrists and arms of persons performing the loading procedure. The stack of trays on the table, with the exception of the bottom tray, is elevated to allow the bottom tray to be moved to a second microchip unloading position. The microchips are picked up one at a time from the tray, inverted and placed on a belt. The belt delivers the microchips to an IC tester. After all of the microchips have been removed from the tray, the tray is moved to a third empty position. The empty tray is transferred to a microchip receiving unit. Microchips from the IC tester are loaded on the tray with a pick up, invert and place mechanism. The tray containing the tested microchips is stacked and then removed from the receiving unit.

DESCRIPTION OF DRAWINGS

FIG. 2 is a diagrammatic view of the mechanism for unloading microchips from a tray and placing the microchips on a belt of the apparatus of FIG. 1;

FIG. 3 is a diagrammatic view of the mechanism for picking up microchips from a belt and loading the microchips on a tray of the apparatus of FIG. 1;

FIG. 4 is a diagrammatic view of the tray transfer mechanism of the apparatus of FIG. 1;

FIG. 6 is an enlarged sectional view taken along the line 6—6 of FIG. 5;

FIG. 10 is an enlarged sectional view taken along the line 10—10 of FIG. 5 showing the tray holders in the down position;

FIG. 11 is a sectional view similar to FIG. 10 showing the tray holders in the up position;

FIG. 12 is a bottom plan view of the tray handling unit of FIG. 5;

FIG. 13 is an enlarged sectional view taken along the line 13—13 of FIG. 12;

FIG. 14 is an enlarged sectional view taken along the line 14—14 of FIG. 5; and

FIG. 15 is a sectional view taken along the line 15—15 of FIG. 10.

DESCRIPTION OF PREFERRED EMBODIMENT

Figure 1:
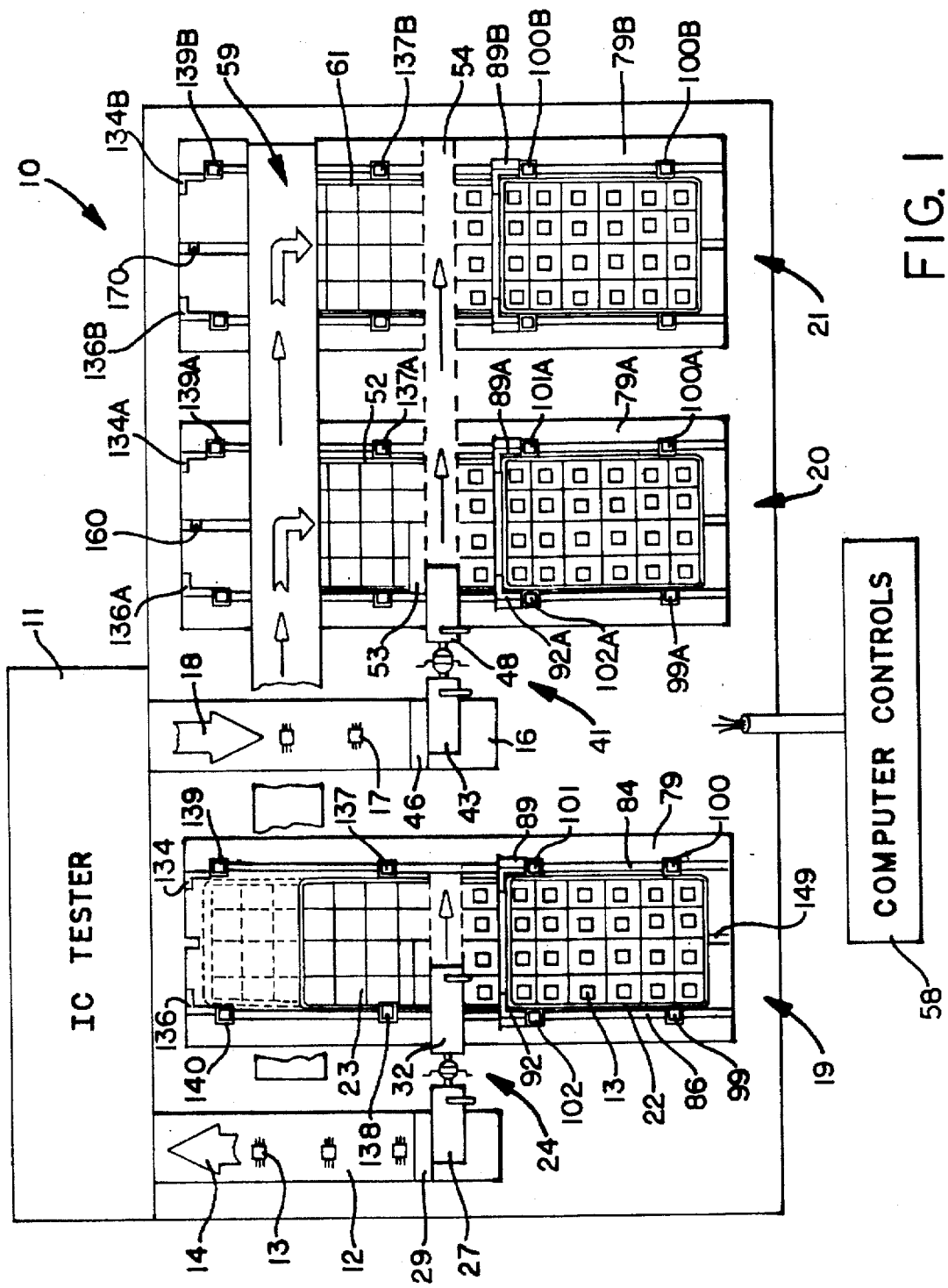
FIG. 1 is a diagrammatic plan view of the IC tray handling apparatus of the invention associated with an IC tester.

Referring to FIG. 1, there is shown a diagrammatic view of the IC tray handling apparatus of the invention indicated generally at 10. The term "IC" refers to integrated circuit flat packages called microchips. The tray handling apparatus 10 operates to supply microchips in sequence to an IC tester 11 and receive the tested microchips from the IC tester 11 and return the microchips to selected trays. The trays are generally flat, rectangular structures having a plurality of pockets that accommodate microchips. An example of a tray for microchips is shown in IBM Technical Disclosure Bulletin No. 110112 dated March, 1991.

Apparatus 10 has a first movable belt 12 for receiving microchips 13 from a loading unit 19 and moving the microchips in the direction of arrow 14 into IC tester 11. Upon completion of the testing of the microchips for both mechanical and electrical characteristics under various thermal environments, the microchips are moved out of tester 11 on a second belt 16. The tested microchips 17 move in the direction of arrow 18 and are placed selectively on trays 52 and 61 retained in receiving units, indicated generally at 20 and 21.

Loading unit 19 accommodates a stack of trays 22 containing microchips to be tested. The stack of trays 22 can be quickly and easily loaded from the end of loading unit 19 with a minimum of strain and stress on the hands, wrist and arm of the person's handling the stack of trays. The method and structure used to load the stack of trays is ergo or work efficient.

Loading unit 19 is operable to move the bottom tray 23 of the stack of trays to a location where microchips are selectively picked up from the tray and placed on belt 12 with a pick up and transfer mechanism, indicated generally at 24. As shown in FIG. 2, mechanism 24 has a first unit 26 comprising an air cylinder 27 attached to a vacuum suction cup 27. Air cylinder 28 is rotatably mounted on a stepping motor 29 operable to move the cylinder 27 from a generally vertical position to a horizontal position. When cylinder 27 is in the vertical position, the suction cup 28 is moved down to place microchip 13 on belt 12 when the vacuum on suction cup 28 is released. Mechanism 24 has a second unit 31 comprising an air cylinder 32 operatively associated with a vacuum suction cup 33. Air cylinder 32 is operable to move suction cup 33 in a downward direction. A vacuum applied to cup 33 picks up microchip 34 from tray 23. A stepping motor 36, connected to cylinder 32, is operable to rotate cylinder 32 into a horizontal position in general alignment with cylinder 27. Microchip 34 is then transferred to suction cup 28 by releasing the vacuum on cup 33 and applying vacuum to cup 28. Cylinder 27 is then moved to the vertical position, as shown in full lines in FIG. 2, whereby suction cup 27 is then lowered and the vacuum thereon released to place the microchip on belt 12. Stepping motor 36 is laterally moved with a lead screw 37 driven by an electric motor 38. The motor 38 is a reversible motor whereby the stepping motor 36 moves in opposite directions, indicated by arrow 39. This laterally moves air cylinder 32 and suction cup 33 so that it can pick up the laterally located microchips on tray 23. Tray 23 has a plurality of rows of pockets accommodating microchips which are picked up one at a time by suction cup 33. The outwardly directed leads on microchip 34 in tray 23 are directed in a downward direction to protect the leads from damage. The pick up and transfer mechanism 24 inverts the microchips on belt 12 whereby the leads are directed in an upward direction.

A second microchip pick up and transfer unit, indicated generally at 41 in FIG. 3, has a first pick up unit 42 operable to pick up a microchip 17 from belt 16 and move the microchip in a generally horizontal location where it is transferred to a second receiving and depositing unit, indicated generally at 47. First pick up unit 42 has an air cylinder 43 connected to a vacuum suction cup 44. A stepping motor 46 is used to rotate the air cylinder 43 from a generally vertical position to a horizontal position. Second receiving and depositing unit 47 has an air cylinder 48 connected to a vacuum suction cup 49. Suction cup 49 is operable to receive the microchip from suction cup 44 and move the microchip to a generally horizontal position adjacent tray 52. Microchip 51 is then placed on the tray 52. Air cylinder 48 is moved with the operation of a stepping motor 53. Stepping motor 53 is movably mounted on a generally horizontal rail 54 for lateral movement to allow rejected microchips to be placed in a second tray 61. An endless chain drive 56, connected to stepping motor 53, is driven by an electric motor 57. The valves (not shown) for controlling the air and vacuum supply to air cylinders 27, 32, 43 and 48 and vacuum suction cups 28, 34, 44 and 49, as well as the electric power to the stepping motors 29, 36, 46, and 53 and, the lateral drive motors 38 and 57 are controlled with a computer control 58 and computer program incorporated therein.

Referring to FIG. 4, there is shown the tray transfer device, indicated generally at 59, for laterally moving the empty trays from loading unit 19 to one of receiving units 20 and 21. When tray 23, in loading unit 19 is empty, the tray transfer device 59 picks up the tray and moves it laterally to either the receiving unit 20 or receiving unit 21. Microchips are then reloaded onto the trays in the receiving units 20 and 21 with the approved microchips being loaded on receiving unit 20 and the rejected microchips being loaded in the tray 61 on receiving unit 21. Tray transfer device 59 has a carriage 62 that is movably mounted on a transverse rail 63 located above the rear portions of the loading unit 19 and receiving units 20 and 21. Carriage 62 is laterally moved along rail 63 with an endless cable or cord 64, driveably connected to a reversible electric motor 66, as indicated by arrow 67. Other structures, such as lead screws, can be used to move carriage 62 along rail 63. A downwardly-opened yolk 68, having pick up pads 69 and 71, is adapted to grip opposite sides of a tray. Pads 69 and 71 can be expandable members that operate in response to air pressure to grip opposite sides of the tray. Movable gripping pawls can be used in lieu of pads 69 and 71 to pick up the empty trays and deposit the empty trays on one of the receiving units 20 or 21. The empty trays are vertically moved upwardly by the second tray lift members or holders, hereinafter described. The top tray is moved up into yolk 68 and is retained therein. The remaining empty trays are lowered and the carriage 62 moved along rail 63 to relocate the empty tray on one of the receiving units 20 or 21. Other structures can be used to move the empty trays from loading unit 19 to receiving units 20 and 21.

Figure 8:
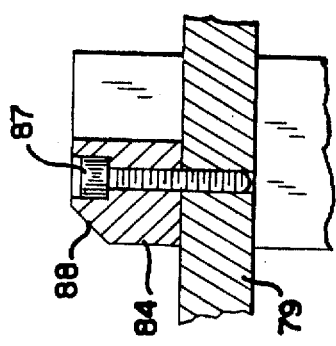
FIG. 8 is an enlarged sectional view taken along the line 8—8 of FIG. 5.
Figure 9:
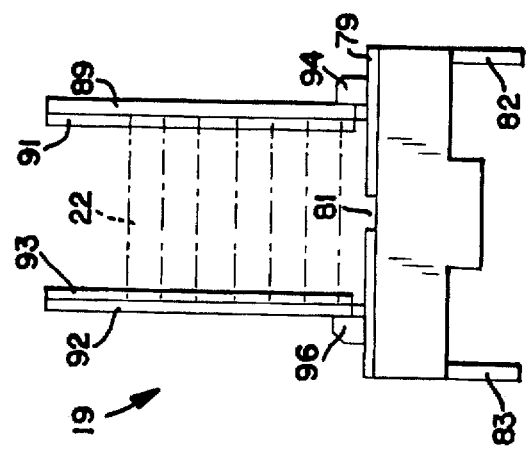
FIG. 9 is an end view of the inlet end of the tray handling unit of FIG. 5.
Figure 5:
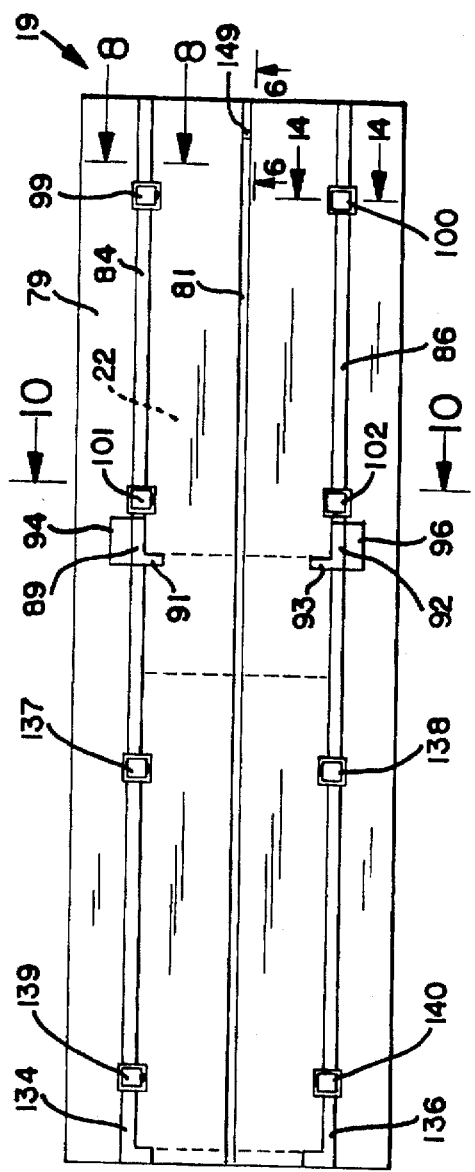
FIG. 5 is a top plan view of a tray handling unit of the apparatus of FIG. 1.
Figure 7:
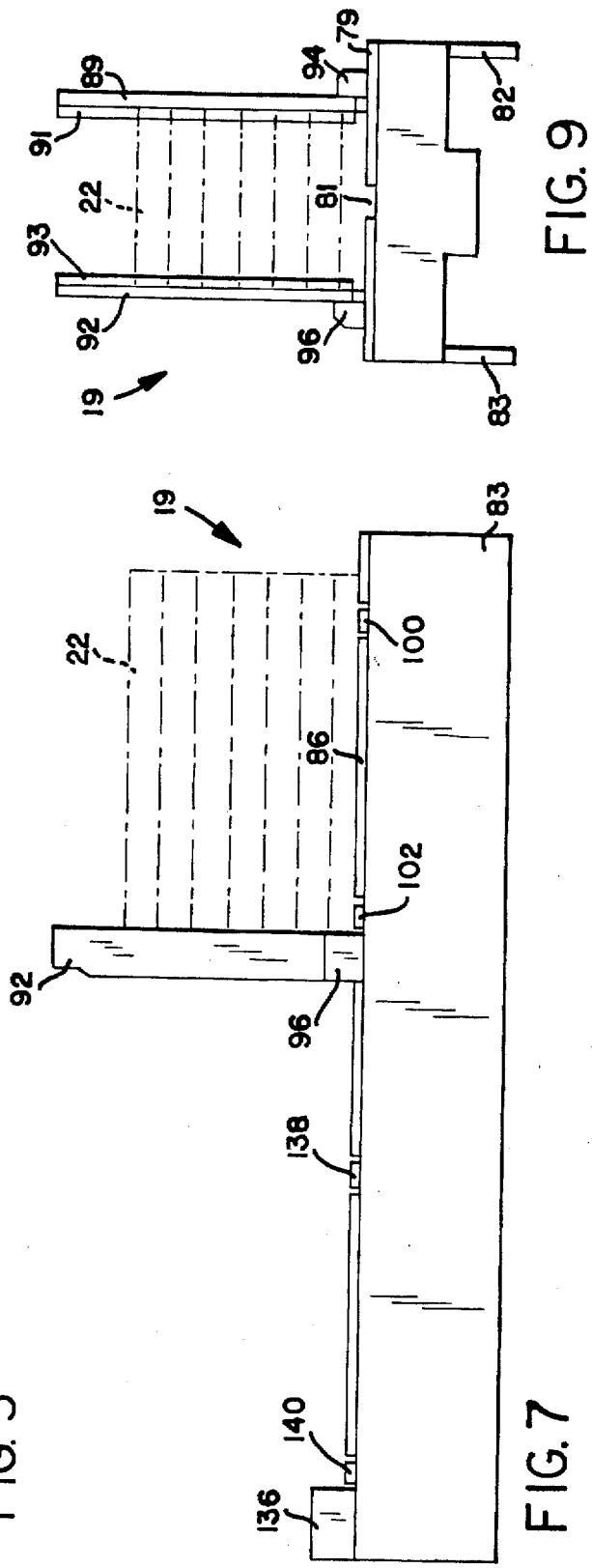
FIG. 7 is a side elevational view of the tray handling unit of FIG. 5.

Referring to FIGS. 5, 7 and 9, loading unit 19 has a flat top table 79 with a longitudinal middle slot 81. Opposite flat side walls 82 and 83 are joined to opposite longitudinal edges of table top 79 to support table 79 above a fixed surface. A pair of longitudinal guides or ribs 84 and 86 are secured to the top of table 79 with a plurality of bolts 87, as seen in FIG. 8. Ribs 84 and 86 are linear parallel members laterally spaced from each other. The lateral or transverse space between ribs 84 and 86 is slightly greater than the width of a tray so that the bottom tray is free to move longitudinally along table 79. Ribs 84 and 86 have inwardly-directed beveled edges 88 to facilitate the insertion of a stack of trays 22 on top table 79. A pair of upright posts 89 and 92 are attached to table 79 with blocks 94 and 96. Post 89 has an inwardly-directed lip 91 which is aligned with an inwardly-directed lip 93 on post 92. The lips 91 and 93 serve as stops for positioning the longitudinal location of the stack of trays 22 on top of table 79. As seen in FIG. 9, the bottom edges of lips 91 and 93 are spaced above the top of table 79 to allow a bottom tray to be moved along table 79 in a forward direction toward rear stops 134 and 136. The upright inside walls of posts 89 and 92 provide lateral upright guide surfaces for the stack of trays 22. The stack of trays 22 are merely placed on the top of table 79 between ribs 84 and 86 with the forward ends of the stack of trays 22 in engagement with lips 91 and 93. The entire stack of trays 22 is quickly and easily loaded with generally horizontal motion from the end of the loading unit 19, as there are no structures that interfere with the horizontal movement of the stack of trays 22 as they are moved into engagement with lips 91 and 93. Vertical lifting and subsequent dropping of the stack of trays is not required to place the trays on the loading unit. This substantially reduces the strain and stress on the hands, wrists and arms of personnel handling the stack of trays 22.

Referring to FIGS. 10 and 11, tray handling apparatus 10 has a tray holding assembly, indicated generally at 97, operable to lift the stack of trays 22, leaving the bottom tray on table 79. When the bottom tray has been moved forward to the empty tray location, the tray holding assembly 97 will lower the stack of trays 22 so that another bottom tray can be unloaded. When the empty tray is in the empty tray location it is in engagement with end stops 134 and 136.

Tray holding assembly 97 has a generally horizontal plate 98 located below table 79. Four upright members or holders 99, 100, 101 and 102 are attached to plate 98 with a plurality of bolts 106 and 107. Upright members 99 and 100 extend through holes 103 and 104 in table 79. Upright members 101 and 102 extend through similar holes in table 79. As seen in FIG. 5, upright members 99 and 101 are aligned with rail 84 so as not to interfere with the loading of the stack of trays 22 onto the top of table 79. Upright members 101 and 102 are aligned with rail 86 so as to not interfere with the location of the stack of trays 22 onto the top of table 79.

Referring to FIG. 14, upright member 100 has a recess 112 accommodating a pawl 108. Pawl 108 has an inwardly-directed lip 109 adapted to engage the side of a tray. A pivot pin 111 pivotally connects pawl 108 to upright member 100 to allow lip 109 to move into recess 112 whereby the pawl can move past the bottom tray of the stack of trays 22. An air cylinder 113 interposed between the upright member 100 and pawl 108 functions to control the position of pawl 108. A fluid line 114 connects the air cylinder 113 to a source of fluid under pressure and a valving structure (not shown) to control the operation of fluid cylinder 113. Each of the upright members 99, 100, 101 and 102 has a similar pawl which engages an adjacent side of a tray, as seen in FIG. 11.

Plate 98 is supported on four upright lead screws 114, 115, 116 and 117. Rotation of the lead screws causes plate 98 to selectively move up and down thereby moving the upright members 99—102 from a lower position to an upper position to raise the stack of trays 22 above the bottom tray and subsequently return from an upper position to a lower position, as seen in FIG. 10.

Referring to FIG. 13, there is shown a detailed structure of lead screw 117 and its operative association with plate 98. Lead screws 115, 116 and 117 have the same structure. An upper support block 118 secured to the side wall 82 has a roller bearing 119 accommodating the upper end of lead screw 117. A similar support block 120 is secured to the lower side of side wall 82 and accommodates a roller bearing 121 for the lower end of lead screw 117. A sleeve 122 has internal threads that accommodate the threads of lead screw 117. Sleeve 122 extends through a hole 123 in plate 98 and is secured thereto with bolts 124. Sleeve 122 projects upwardly from the top of plate 98 and is adapted to engage the upper support block 118 when plate 98 is in its up position. A gear 126, secured to the lower end of lead screw 117, accommodates an endless belt 131. As seen in FIG. 12, belt 131 is trained about gears 127, 128 and 129 attached to the lead screws on the corners of plate 98. Belt 131 is trained about a drive gear 132 which is attached to a reversible electric motor 133, such as a stepping motor. Motor 133 is operable to move belt 131 thereby simultaneously rotating the lead screws 114, 115, 116 and 117 to selectively raise and lower plate 98. Holders 99–101 move in opposite vertical directions to raise and hold the stack of trays during the unloading of microchips from the bottom tray.

Returning to FIG. 5, loading unit 19 has a pair of rear stops 134 and 136 mounted on top of table 79. Stops 134 and 136 determine the empty tray position of the tray on table 79. Upright members or holders 137, 138, 139 and 140 are located along ribs 84 and 86 on opposite sides of the tray and are operable to raise a stack of empty trays up in an upward direction to allow another empty tray to be moved toward stops 134 and 136. The top tray is moved up into yolk 68 so that it can be transported to one of receiving units 20 or 21. Holders 137, 138, 139 and 140 are mounted on a generally horizontal plate which is selectively raised and lowered with lead screws, such as plate 98 and lead screws 114, 115, 116 and 117, as shown in FIGS. 10 and 11. Computer control 58 regulates the operation holders 137–140.

Referring to FIG. 6, there is shown a tray moving mechanism, indicated generally at 141, for moving the bottom tray from its initial load position to the unload position generally in the middle of table 79 and the empty tray position adjacent the rear stops 136 and 137. The tray moving mechanism 141 is mounted on a pair of longitudinal rails 142 and 143 located below the top of table 79 adjacent opposite sides of the slot 81. A carriage 144, having rollers 146 and 147, is movably mounted on rails 142 and 143. A finger 148, having an upright end 149, located within slot 81, is connected with a pivot 151 to carriage 144. An air cylinder 152 mounted on carriage 144 has an upright piston rod 153 connected with a pivot 154 to finger 148 whereby operation of air cylinder 152 causes the finger to pivot in an upward direction to move the end 149 of the finger adjacent the back of tray 23. Air cylinder 152 is also operable to retract finger 148 below the top of table 79 so that tray moving mechanism 141 can be moved back to its original position without affecting the stack of trays 22. A reversible electric motor 156, such as a stepping motor, is operably connected to a cable and pulley structure 157 that is joined to carriage 144 so that carriage 144 can be reciprocated below the top of table 79 to selectively move bottom tray 21 in a forward direction during the unloading of the microchips from the tray. Bottom tray 21 is moved step by step to align a row of microchips with microchip pick up and transfer mechanism 24. When all of the microchips in a row of microchips have been removed, the tray is moved forward so that a second row of microchips can be removed from the tray. The empty tray is moved forward to the empty tray position and another tray is moved forward to the unload position.

The microchips receiving units 20 and 21 have the same structure as loading unit 19. The parts of unit 20 that correspond to the parts of unit 19 have the same reference numbers with the suffix A. The parts of unit 21 that correspond to the parts of unit 19 have the same reference numbers with the suffix B. This structure includes the tray moving mechanism shown in FIG. 6 and the tray holding assembly shown in FIGS. 10, 11, 13, 14 and 15. The tray moving mechanism of receiving unit 20 has an upright finger 160 that is adapted to engage the forward end of the empty tray and move the tray in an outward direction along the top of the table. The receiving unit 21 has a similar finger 170 associated with the tray moving mechanism that moves the tray in an outward direction along the table. The trays are sequentially moved to present open pockets for receiving microchips. When the tray is full of microchips, it is moved with the tray moving mechanism to the unloading position. The tray holding mechanism stacks the trays on the front of the receiving units 20 and 21. The stacks of trays can be conveniently removed from the units 20 and 21 by gripping opposite sides of the trays and longitudinally pulling the trays off of table 79. This is an efficient method of handling the stack of trays which reduces strains and stresses on the hands, wrists and arms of personnel that move the stack of trays.

In use, the operator places a stack of trays 22 onto the loading unit 19. The trays are placed between the longitudinal ribs 84 and 86 into engagement with upright posts 89 and 92. The tray holders 99, 100, 101 and 102 are then lifted to raise the stack of trays, except the bottom tray, above table 79. The tray moving mechanism 141 is then operable to move the bottom tray in a forward direction thereby exposing the rows of microchips to the unloading location. The pick up and transfer mechanism 24 is then operated to pick up microchips from the tray and place them on belt 12. The microchips move along belt 12 into the IC tester where they are tested in accordance with the testing parameters of tester 11. When tray 23 is empty, it is moved into the full empty position into engagement with the end stops 134 and 136. The tray moving mechanism 141 is then moved back to the original position where it can pick up a second tray. The tray holders 99, 100, 101 and 102 are then lowered to place the next tray on table 79. The tray holders 99, 100, 101 and 102 are then elevated to lift the stack of trays, except the bottom tray. The tray moving mechanism 141 is then moved forward to the unloading position to expose microchips to the pick up and transfer mechanism 24. Mechanism 24 operates to unload the microchips from the tray and place them on belt 12 which moves the microchip into IC tester 11.

The tray transfer device 59 is used to move the empty tray from the loading device 19 and place the empty tray on one of the receiving devices 20 or 21.

The second pick up and transfer unit 41 operates to pick up tested microchips 17 from belt 16 and deposit the microchips into trays 52 or 61 on receiving units 20 and 21. The tray moving mechanism with its finger 160 operates to move tray 52 in the forward direction and under the trays in the unloading location. The tray holders of the receiving unit are used to sequentially elevate the trays thereby stacking the trays in the receiving unit. The receiving unit 21 operates in the same manner as receiving unit 20.

While there is shown and described a preferred embodiment of the apparatus and method for handling IC trays, it is understood that changes in the structure, arrangement of structure, parts and method may be made by those skilled in the art without departing from the invention. The invention is defined in the following claims.

I claim:

1. An apparatus for handling trays accommodating microchips comprising: a table for supporting trays for holding microchips, rib means secured to the table for locating the trays on the table and guiding trays along the table, first means operable to move one tray from a first position on the table to a second position on the table, second means for placing microchips on said one tray located in the second position, said first means operable to move the one tray located in the second position after the second means has placed microchips on said one tray to a third position on the table, and tray holding means for lifting a stack of trays located in the third position on the table whereby said one tray is moved by the first means under said stack of trays, said tray holding means being operable to lower the stack of trays on said one tray and subsequently raise the stack of trays including the one tray whereby another tray can be moved under the stack of trays by the operation of the first means.

2. The apparatus of claim 1 including: longitudinal track means located below said table, said table having a longitudinal slot, said first means includes carriage means movably mounted on the track means, finger means pivotally mounted on the carriage means, said finger means having an end movable through said slot into engagement with the one tray, means mounted on the carriage means operable to pivot the finger means to move the end relative to said slot whereby said end selectively is located above the table and below the table, and means for moving the carriage means along the track means thereby moving the one tray from the first position to the second position and from the second position to the third position.

3. The apparatus of claim 1 wherein: the tray holding means includes upright members extended through holes in said table adjacent opposite sides of the one tray located in the third position, said upright members having means engageable with the trays operable to lift the stack of trays except the one tray when the upright members are moved in an upright direction, and means connected to the upright members operable to selectively move the upright members in up and down directions.

4. The apparatus of claim 3 wherein: the means connected to the upright members comprise a plate located below the table, and power means operatively connected to the plate for moving the plate in up and down directions.

5. The apparatus of claim 4 wherein: the power means includes lead screws, sleeves mounted on the plate accommodating the lead screws and drive means for rotating the lead screws thereby moving the plate selectively in up and down directions.

6. The apparatus of claim 3 wherein: the means engageable with the trays are pawls movably mounted on the upright members, and devices to move the pawls to a first position for engagement with a tray and to a second position wherein the pawls do not engage the tray.

7. An apparatus for handling trays accommodating microchips comprising: first means operable to move one tray from a first position to a second position, second means for placing microchips on said one tray located in the second position, said first means operable to move the one tray located in the second position after the second means has placed microchips on said one tray to a third position, tray holding means for lifting a stack of trays located in the third position whereby said one tray is moved by the first means under said stack of trays, said tray holding means being operable to lower the stack of trays on said one tray and subsequently raise the stack of trays including the one tray whereby another tray can be moved under the stack of trays by the operation of the first means, said tray holding means including upright members adjacent opposite sides of the one tray located in the third position, said upright members having means engageable with the trays operable to lift the stack of trays except to one tray when the upright members are moved in an upright direction, and means connected to the upright members operable to selectively move the upright members in up and down directions, said means connected to the upright members comprise a plate, and power means operatively connected to the plate for moving the plate in up and down directions, said power means includes lead screws, sleeves mounted on the plate accommodating the lead screws and drive means for rotating the lead screws thereby moving the plate selectively in up and down directions.

8. The apparatus of claim 7 wherein: the means engageable with the trays are pawls movably mounted on the upright members, and devices to move the pawls to a first position for engagement with a tray and to a second position wherein the pawls do not engage the tray.

* * * * *